(12) United States Patent
Koyama et al.

(10) Patent No.: US 8,836,555 B2
(45) Date of Patent: Sep. 16, 2014

(54) CIRCUIT, SENSOR CIRCUIT, AND SEMICONDUCTOR DEVICE USING THE SENSOR CIRCUIT

(71) Applicant: Semiconductor Energy Laboratory Co., Ltd., Atsugi (JP)

(72) Inventors: Jun Koyama, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/740,801

(22) Filed: Jan. 14, 2013

(65) Prior Publication Data
US 2013/0181854 A1    Jul. 18, 2013

(30) Foreign Application Priority Data

Jan. 18, 2012   (JP) ................... 2012-007688

(51) Int. Cl.
| | |
|---|---|
| *H03M 1/00* | (2006.01) |
| *G01D 3/028* | (2006.01) |
| *H01L 29/00* | (2006.01) |
| *G11C 27/02* | (2006.01) |
| *H03M 1/12* | (2006.01) |
| *H01L 27/12* | (2006.01) |

(52) U.S. Cl.
CPC ............ *H03M 1/124* (2013.01); *G01D 3/028* (2013.01); *H01L 29/00* (2013.01); *G11C 27/026* (2013.01); *H01L 27/1225* (2013.01)
USPC ............. 341/122; 327/82; 327/91; 327/94; 327/355; 327/359; 455/313; 455/323; 455/324; 455/325; 375/346; 375/361

(58) Field of Classification Search
USPC ........ 341/118–168; 327/82, 91, 94, 355, 359, 327/361; 455/313, 323, 324, 325; 375/346, 375/361
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Lam T Mai
(74) *Attorney, Agent, or Firm* — Nixon Peabody LLP; Jeffrey L. Costellia

(57) ABSTRACT

A sensor circuit for obtaining physical quantities with a small margin of error even when the temperature varies is provided. The sensor circuit includes a sensor, a sampling circuit for obtaining a voltage value or a current value of a signal output from the sensor during a predetermined period and holding the value, and an analog-to-digital converter circuit for converting the held analog voltage value or current value into a digital value. The sampling circuit includes a switch for obtaining the voltage value or the current value and holding the value. The switch includes a transistor including an oxide semiconductor in a channel formation region.

20 Claims, 15 Drawing Sheets

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,443,331 B2* | 10/2008 | Cormier, Jr. | 341/155 |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,956,652 B2* | 6/2011 | Tomisato | 327/82 |
| 8,030,974 B1* | 10/2011 | Oo | 327/94 |
| 8,354,865 B1* | 1/2013 | Oo | 327/94 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0008648 A1* | 1/2004 | Schmidl et al. | 370/335 |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0237119 A1* | 9/2009 | Tomisato | 327/82 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0062435 A1 | 3/2011 | Yamazaki et al. | |
| 2011/0121878 A1 | 5/2011 | Kato et al. | |
| 2011/0133196 A1 | 6/2011 | Yamazaki et al. | |
| 2011/0148463 A1 | 6/2011 | Kato et al. | |
| 2011/0193520 A1* | 8/2011 | Yamazaki et al. | 320/108 |
| 2011/0233555 A1* | 9/2011 | Endo | 257/60 |
| 2011/0267297 A1* | 11/2011 | Yamazaki et al. | 345/173 |
| 2013/0294481 A1 | 11/2013 | Koyama et al. | |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 05-251705 | 9/1993 |
| JP | 08-264794 | 10/1996 |
| JP | 11-505377 | 5/1999 |
| JP | 2000-044236 | 2/2000 |
| JP | 2000-150900 | 5/2000 |
| JP | 2000-329592 | 11/2000 |
| JP | 2001-147163 | 5/2001 |
| JP | 2002-076356 | 3/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-273614 | 9/2004 |
| JP | 2004-273732 | 9/2004 |
| WO | WO-2004/114391 A1 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous IN-GA-ZN-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZNO TFT,", IMID '07 Digest, 2007, pp. 1249-1252.

Godo.H et al., "Temperature Dependence of Characteristics and Electronic Structure for Amorphous IN-GA-ZN-Oxide TFT,", AM-FPD '09 Digest of Technical Papers, Jul. 1, 2009, pp. 41-44.

Osada.T et al., "Development of Driver-Integrated Panel Using Amorphous IN-GA-ZN-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous IN-GA-ZN-Oxide TFT,", SID Digest '09 : SID International Symposium Digest of Technical Papers, May 31, 2009, pp. 1110-1112.

Ohara.H et al., "21.3:4.0 In. QVGA AMOLED Display Using IN-GA-ZN-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner 301 302 303 305 307 308 309 306 304 310

331 333 330 332s 332c 332d 334 336 337 335

332

CIRCUIT, SENSOR CIRCUIT, AND SEMICONDUCTOR DEVICE USING THE SENSOR CIRCUIT

BACKGROUND OF THE INVENTION

1. Field of the Invention

The present invention relates to a circuit for a sensor which includes both an analog circuit and a digital circuit, a sensor circuit in which a sensor is added to the circuit, and a semiconductor device using the sensor circuit.

2. Description of the Related Art

A sensor is a kind of input device and has a function of converting physical quantities such as light, sound, temperature, magnetism, and pressure into electric signals (sensor signals). A sensor circuit includes the sensor and a circuit for processing sensor signals output from the sensor. Since the sensor signals output from the sensor are generally analog signals, the analog sensor signals need to be converted into digital signals before input to a signal processing circuit such as a microcomputer from the sensor circuit. Therefore, the circuit included in the sensor circuit can be classified into an analog circuit for processing analog sensor signals and a digital circuit for processing digital sensor signals.

A device for measuring physical quantities is disclosed in Patent Document 1; in the device, a detected analog signal is converted into a digital signal by an analog-to-digital converter circuit in accordance with a sampling pulse from a sampling circuit. A temperature detection device is disclosed in Patent Document 2; in the device, a voltage value of a signal flowing in a semiconductor element is held by a sample hold circuit and converted into a digital signal by an analog/digital (AD) converter circuit.

REFERENCES

Patent Documents

[Patent Document 1] Japanese Published Patent Application No. 2000-329592
[Patent Document 2] Japanese Published Patent Application No. 2001-147163

SUMMARY OF THE INVENTION

In the case where an analog value of a sensor signal continuously varies with time, the sensor signal needs to be sampled in a sampling circuit every certain period of time so that the sampled sensor signal is transmitted to an AD (analog/digital) converter circuit. If the analog value of the sensor signal which has been sampled in the sampling circuit varies, a digital value obtained by converting the analog sensor signal into a digital signal (AD conversion) in the AD converter circuit is likely to have a margin of error. Hence, the analog value of the sampled sensor signal needs to be certainly held in the sampling circuit so as not to be changed.

In the sampling circuit, however, a transistor including silicon in a channel formation region is generally used as a switch for holding the analog value of the sampled sensor signal. Such a transistor including silicon in a channel formation region tends to have higher off-state current with an increase in temperature; accordingly, the analog value of the sampled sensor signal is likely to vary due to the off-state current of the transistor with a rise in the temperature of the sensor circuit. As a result, the digital value of the sensor signal obtained by AD conversion has a great margin of error, which would cause a phenomenon that an accurately measured value of physical quantities is difficult to obtain. Such a phenomenon is significantly likely to occur when the temperature of the sampling circuit exceeds 120° C.

In view of the aforementioned technical background, an object of one embodiment of the present invention is to provide a circuit for obtaining physical quantities with a small margin of error even when the temperature of the circuit varies. Another object of one embodiment of the present invention is to provide a sensor circuit for obtaining physical quantities with a small margin of error even when the temperature of the sensor circuit varies. Still another object of one embodiment of the present invention is to provide a semiconductor device in which physical quantities with a small margin of error can be obtained even when the temperature of a sensor circuit varies and which can operate in accordance with the obtained physical quantities.

In a circuit of one embodiment of the present invention, a transistor including an oxide semiconductor in a channel formation region is used as a switch for controlling the sampling of a sensor signal in a sampling circuit. The transistor including an oxide semiconductor in a channel formation region has much lower off-state current than transistors including a general semiconductor such as silicon or germanium, and the off-state current thereof has a low temperature dependence.

Accordingly, even when the temperature of the circuit for a sensor, more specifically, the temperature of the sampling circuit included in the circuit for the sensor varies, it is possible to significantly reduce the amount of charge leaking through a switch which controls the sampling of the sensor signal. Thus, the analog value of a sampled sensor signal can be prevented from varying, which prevents occurrence of a great margin of error of the digital value of the sensor signal obtained by AD conversion.

Note that a highly purified oxide semiconductor obtained by a reduction of impurities such as moisture or hydrogen which serves as an electron donor (donor) and by a reduction of oxygen vacancies is an intrinsic (i-type) semiconductor or a substantially i-type semiconductor. Therefore, a transistor including the oxide semiconductor has an extremely small amount of off-state current. Furthermore, the band gap of the oxide semiconductor is 2 eV or more, preferably 2.5 eV or more, and more preferably 3 eV or more. With use of an oxide semiconductor film which is highly purified by a sufficient decrease in the concentration of impurities such as moisture and hydrogen and a reduction of oxygen vacancies, the off-state current of a transistor can be reduced.

Specifically, various experiments can prove low off-state current of a transistor in which a highly purified oxide semiconductor is used for a semiconductor film. For example, even with an element with a channel width of $1 \times 10^6$ μm and a channel length of 10 μm, in the range of from 1 V to 10 V of voltage (drain voltage) between a source terminal and a drain terminal, the off-state current can be lower than or equal to the measurement limit of a semiconductor parameter analyzer, that is, lower than or equal to $1 \times 10^{-13}$ A. In that case, it can be seen that the off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly purified oxide semiconductor film is used for a channel formation region of the transistor, and the off-state current of the transistor is measured from a change in the amount of charge of the capacitor per unit time. As a result, it is found that, in the case where the voltage between the source terminal and the drain terminal of the transistor is 3 V, a lower off-state current of several tens of yoctoamperes per micrometer (yA/μm) is obtained. Consequently, the transistor whose channel formation region is formed in a highly purified oxide semiconductor film has much lower off-state current than a transistor including silicon.

Specifically, a sensor circuit of one embodiment of the present invention includes a sensor, a sampling circuit for obtaining a voltage value or a current value of a signal output from the sensor during a predetermined period and holding the value, and an analog-to-digital converter circuit for converting the held analog voltage value or current value into a digital value. The sampling circuit includes a switch for obtaining the voltage value or the current value and holding the value. The switch includes a transistor using an oxide semiconductor for a channel formation region.

Further, specifically, a semiconductor device of one embodiment of the present invention includes a sensor circuit for generating a first digital signal including as information the physical quantities of an object to be detected, an output device, and a signal processing circuit for controlling the operation of the output device with the use of the first signal. The sensor circuit includes a sensor for generating a second analog signal including as information the physical quantities of the object to be detected, a sampling circuit for obtaining a voltage value or a current value of the second signal during a predetermined period and holding the value, and an analog-to-digital converter circuit for generating the first signal by converting the held analog voltage value or current value into a digital value. The sampling circuit includes a switch for obtaining the voltage value or the current value and holding the value. The switch includes a transistor using an oxide semiconductor for a channel formation region.

According to one embodiment of the present invention, it is possible to provide a sensor circuit for obtaining physical quantities with a small margin of error even when the temperature of the sensor circuit varies. Alternatively, according to one embodiment of the present invention, it is possible to provide a semiconductor device in which physical quantities with a small margin of error can be obtained even when the temperature of a sensor circuit varies and which can operate in accordance with the obtained physical quantities.

DETAILED DESCRIPTION OF THE INVENTION

Hereinafter, embodiments of the present invention will be described in detail with reference to the accompanying drawings. Note that the present invention is not limited to the description below, and it is easily understood by those skilled in the art that modes and details can be modified in various ways without departing from the scope and spirit of the present invention. Therefore, the present invention is not construed as being limited to description of the embodiments.

Note that a sensor circuit of one embodiment of the present invention can be employed for a wide variety of semiconductor devices such as integrated circuits, RF tags, and semiconductor display devices. The semiconductor devices using a sensor circuit are included in the category of the present invention. The integrated circuits include, in their category, microprocessors, image processing circuits, digital signal processors (DSPs), microcontrollers, and large scale integrated circuits (LSIs) including any of them, and programmable logic devices (PLDs) such as a field programmable gate array (FPGA) and a complex PLD (CPLD). The semiconductor display devices include, in their category, liquid crystal display devices, light-emitting devices having pixels each provided with a light-emitting element typified by an organic light-emitting element (OLED), electronic paper, digital micromirror devices (DMDs), plasma display panels (PDPs), field emission displays (FEDs), and the like.

<Structure of Sensor Circuit>

Figure 1A:
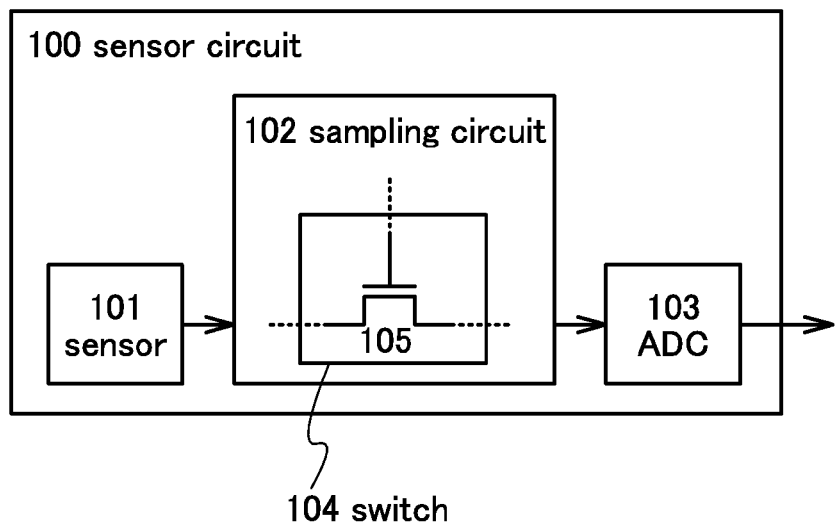
FIG. 1A illustrates a structure of a sensor circuit and FIG. 1B illustrates a structure of a transistor.

FIG. 1A is a block diagram illustrating an example of a structure of a sensor circuit of one embodiment of the present invention. In this specification, components are classified by their functions and illustrated as independent blocks in block diagrams; in practice, the components are difficult to divide completely and one component may have a plurality of functions.

A sensor circuit 100 illustrated in FIG. 1A includes a sensor 101, a sampling circuit 102, and an analog-to-digital converter circuit (ADC) 103. The sensor 101 has a function of generating an electric signal (sensor signal) including as information the physical quantities of an object to be detected, specifically, light, sound, temperature, magnetism, pressure, or the like.

Specifically, a temperature sensor, a magnetic sensor, a light sensor, a microphone, a strain gauge, a pressure sensor, a gas sensor, or the like can be used as the sensor 101. The temperature sensor may be a contact sensor such as a resistance temperature detector, a thermistor, a thermocouple, or an IC temperature sensor, or a non-contact sensor such as a thermal type infrared ray sensor or a quantum type infrared ray sensor.

Some of the sensors 101 need a power source such as a constant current source or a constant voltage source, and the others do not need a power source and generate voltage or current by themselves. In the case of the formers, the power source is included in the sensor 101.

A sensor signal output from the sensor 101 is an analog signal. In accordance with a change in the physical quantities of the object to be detected, the voltage value or current value of the sensor signal continuously varies with time. The sampling circuit 102 has a function of obtaining the analog voltage value or current value of the sensor signal during a predetermined period and holding the value, namely, a sampling function.

Specifically, the sampling circuit 102 includes a switch 104. When the switch 104 is on (in a conductive state), the analog voltage value or current value of the sensor signal is obtained. When the switch 104 is off (in a non-conductive state), the obtained voltage value or current value is held. In one embodiment of the present invention, a transistor 105 including an oxide semiconductor in a channel formation region is used as the switch 104.

Note that either a single transistor 105 or a plurality of transistors 105 may be used as the switch 104. In the case where a plurality of transistors 105 function as a single switch 104, the plurality of transistors 105 may be connected to each other in parallel, in series, or in combination of parallel connection and series connection.

In this specification, the state where transistors are connected in series to each other means a state where only one of a source terminal and a drain terminal of a first transistor is connected to only one of a source terminal and a drain terminal of a second transistor. The state where transistors are connected in parallel to each other means a state where one of a source terminal and a drain terminal of a first transistor is connected to one of a source terminal and a drain terminal of a second transistor and the other of the source terminal and the drain terminal of the first transistor is connected to the other of the source terminal and the drain terminal of the second transistor.

Note that a "source terminal" of a transistor means a source region which is a part of an active layer or a source electrode connected to the active layer. Similarly, a "drain terminal" of a transistor means a drain region which is a part of an active layer or a drain electrode connected to the active layer.

Note that the terms "source terminal" and "drain terminal" of a transistor interchange with each other depending on the type of the channel of the transistor or levels of potentials applied to the source terminal and the drain terminal. In general, in an n-channel transistor, a terminal to which a lower potential is applied is called a source terminal, and a terminal to which a higher potential is applied is called a drain terminal. Further, in a p-channel transistor, a terminal to which a lower potential is applied is called a drain terminal, and a terminal to which a higher potential is applied is called a source terminal. In this specification, although the connection relation of the transistor is described assuming that the source terminal and the drain terminal are fixed in some cases for convenience, actually, the names of the source terminal and the drain terminal interchange with each other depending on the relation of the potentials.

The ADC 103 converts the sampled analog voltage value or current value into a digital voltage value or current value. In other words, the sampled sensor signal is converted from analog to digital in the ADC 103. The sensor signal which has been converted into a digital signal includes as information the physical quantities of an object to be detected which correspond to the sampled analog sensor signal.

The digital sensor signal generated in the ADC 103 is transmitted from the sensor circuit 100 to a signal processing circuit such as a microcomputer.

The sampling circuit 102 may include not only the switch 104 but also a capacitor for surely holding the sampled analog voltage value or current value. Alternatively, the sampling circuit 102 may include not only the switch 104 but also an impedance converter such as a voltage follower.

<Structure of Transistor 105>

Figure 1B:
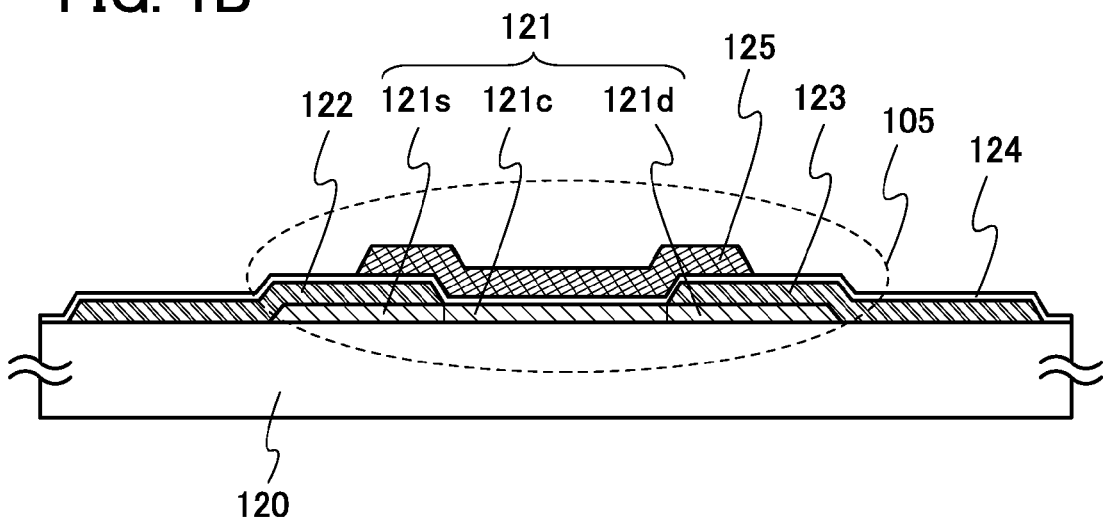

In one embodiment of the present invention, an oxide semiconductor is used for a channel formation region of the transistor 105 included in the switch 104. As described above, the oxide semiconductor included in the channel formation region allows an extremely low off-state current of the transistor 105. FIG. 1B illustrates an example of a cross-sectional view of the transistor 105.

The transistor 105 in FIG. 1B includes, over a substrate 120 having an insulating surface, a semiconductor film 121 serving as an active layer, a source electrode 122 and a drain electrode 123 over the semiconductor film 121, a gate insulating film 124 over the semiconductor film 121, the source electrode 122, and the drain electrode 123, and a gate electrode 125 over the gate insulating film 124, which overlaps with the semiconductor film 121 between the source electrode 122 and the drain electrode 123.

In the transistor 105 illustrated in FIG. 1B, a region of the semiconductor film 121, which is between the source electrode 122 and the drain electrode 123 and overlaps with the gate electrode 125, corresponds to a channel formation region 121c. A region of the semiconductor film 121 which overlaps with the source electrode 122 corresponds to a source region 121s, and a region of the semiconductor film 121 which overlaps with a drain electrode 123 corresponds to a drain region 121d.

In one embodiment of the present invention, the oxide semiconductor only needs to be included in the channel formation region 121c of the semiconductor film 121; the oxide semiconductor may be included in the whole of the semiconductor film 121.

Although FIG. 1B illustrates the transistor 105 with a single-gate structure, the transistor 105 may have a multi-gate structure in which a plurality of electrically connected gate electrodes are provided so that a plurality of channel formation regions are included.

The transistor 105 only needs to have a gate electrode on one side of the active layer; the transistor 105 may include a pair of gate electrodes with the active layer interposed therebetween. In the case where the transistor 105 includes a pair of gate electrodes with the active layer interposed therebetween, a signal for controlling switching (on/off) is applied to one of the gate electrodes, and the other of the gate electrodes may be in a floating state (i.e., electrically insulated) or applied with a potential. In the latter case, potentials with the same level may be applied to the pair of gate electrodes, or a fixed potential such as a ground potential may be applied only to the other of the gate electrodes. By controlling the level of a potential applied to the other of the gate electrodes, the threshold voltage of the transistor 105 can be controlled.

Unless otherwise specified, in the case of an n-channel transistor, the off-state current in this specification is a current which flows between a source terminal and a drain terminal when, in the state where the potential of the drain terminal is greater than that of the source terminal and that of a gate electrode, the potential of the gate electrode is less than or equal to zero with respect to the potential of the source terminal. In the case of a p-channel transistor, the off-state current in this specification is a current which flows between a source terminal and a drain terminal when, in the state where the potential of the drain terminal is less than that of the source terminal and that of a gate electrode, the potential of the gate electrode is greater than or equal to zero with respect to the potential of the source terminal.

The oxide semiconductor preferably contains at least indium (In) or zinc (Zn). The oxide semiconductor preferably contains, in addition to In and Zn, gallium (Ga) serving as a stabilizer that reduces variations in the electrical characteristics of the transistor using the oxide semiconductor. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, it is possible to use an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=$\frac{1}{3}$:$\frac{1}{3}$:$\frac{1}{3}$) or In:Ga:Zn=2:2:1 (=$\frac{2}{5}$:$\frac{2}{5}$:$\frac{1}{5}$), or an oxide whose composition is in the neighborhood of the above composition can be used. Alternatively, an In—Sn—Zn-based oxide with an atomic ratio of In:Sn:Zn=1:1:1 (=$\frac{1}{3}$:$\frac{1}{3}$:$\frac{1}{3}$), In:Sn:Zn=2:1:3 (=$\frac{1}{3}$:$\frac{1}{6}$:$\frac{1}{2}$), or In:Sn:Zn=2:1:5 (=$\frac{1}{4}$:$\frac{1}{8}$:$\frac{5}{8}$), or an oxide whose composition is in the neighborhood of the above composition may be used.

For example, with an In—Sn—Zn-based oxide, high mobility can be comparatively easily obtained. However, even with an In—Ga—Zn-based oxide, mobility can be increased by lowering the defect density in a bulk.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seem from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC- OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to the a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is lower than or equal to $-80°$ C., preferably lower than or equal to $-100°$ C. is used.

By increasing the substrate heating temperature during the deposition, migration of a sputtered particle is likely to occur after the sputtered particle reaches a substrate surface. Specifically, the substrate heating temperature during the deposition is higher than or equal to $100°$ C. and lower than or equal to $740°$ C., preferably higher than or equal to $200°$ C. and lower than or equal to $500°$ C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably higher than or equal to 100 vol %.

As an example of the sputtering target, an In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to $1000°$ C. and lower than or equal to $1500°$ C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Next, actual measured values of a drain current Id of the transistor 105 in FIG. 1B against a gate voltage Vg thereof are described, the values being measured while the temperature of the substrate 120 is changed. Note that the gate voltage Vg means a voltage of the gate electrode 125 with the potential of the source electrode 122 used as a reference.

First, a specific structure of the transistor 105 used for measurement is described. The transistor 105 used for measurement has a channel length L of 3 µm (the length of the channel formation region 121c in the direction in which carriers move), and a channel width W of 50 µm (the length of the channel formation region 121c in the direction perpendicular to the direction in which carriers move). As the semiconductor film 121, an In—Ga—Zn-based oxide semiconductor film with a thickness of 35 nm is used. As the gate insulating film 124, a silicon oxynitride film with a thickness of 200 nm is used. For the gate electrode 125, a tungsten film with a thickness of 100 nm is used. Each of the source electrode 122 and the drain electrode 123 is formed using a conductive film in which a titanium film with a thickness of 100 nm, an aluminum film with a thickness of 400 nm, and a titanium film with a thickness of 100 nm are stacked in this order.

Note that in this specification, an oxynitride refers to a substance containing a larger amount of oxygen than that of nitrogen, and a nitride oxide refers to a substance containing a larger amount of nitrogen than that of oxygen.

The measurement is performed with drain voltages Vd of 1 V and 10 V. Note that the drain voltage Vd means a voltage of the drain electrode 123 with the potential of the source electrode 122 used as a reference. In the measurement, the substrate temperature is set to $-30°$ C., $25°$ C., $105°$ C., and $150°$ C.

Figure 2:
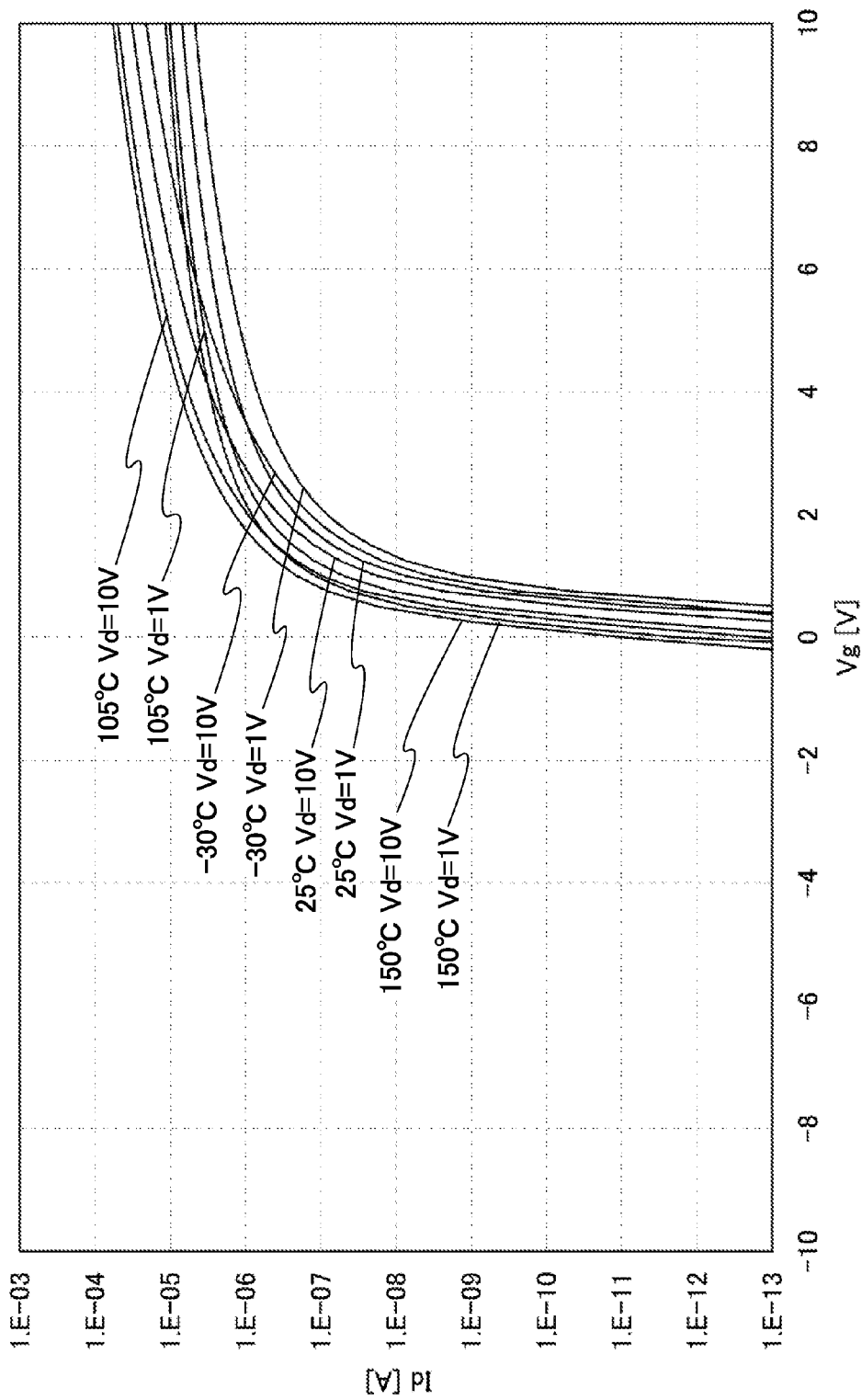
FIG. 2 illustrates a drain current value against a gate voltage.

FIG. 2 shows values of the drain current Id (A) of the transistor 105 against the gate voltage Vg (V) thereof, which are obtained by the measurement. FIG. 2 shows that in both cases of the drain voltages Vd of 1 V and 10 V, the off-state current of the transistor 105 is lower than $1 \times 10^{-13}$ A, which is the lowest measurement limit, even at the highest temperature of $150°$ C.

As seen from the example of the transistor 105, the off-state current of the transistor including an oxide semiconductor in a channel formation region has an extremely low temperature dependence. Therefore, when the transistor including an oxide semiconductor in a channel formation region is used as the switch 104 in the sampling circuit 102 illustrated in FIG. 1A, the amount of charge leaking through the switch 104 can be significantly reduced even when the temperature of the sampling circuit 102 varies. It is thus possible to prevent a variation in the analog value of a sampled sensor signal, and prevent occurrence a great margin of error of the digital value of the sensor signal obtained by AD conversion.

<Specific Example of Sensor Circuit>

Then, an example of the structure of the sensor circuit in FIG. 1A of one embodiment of the present invention is described in more detail.

Figure 7:
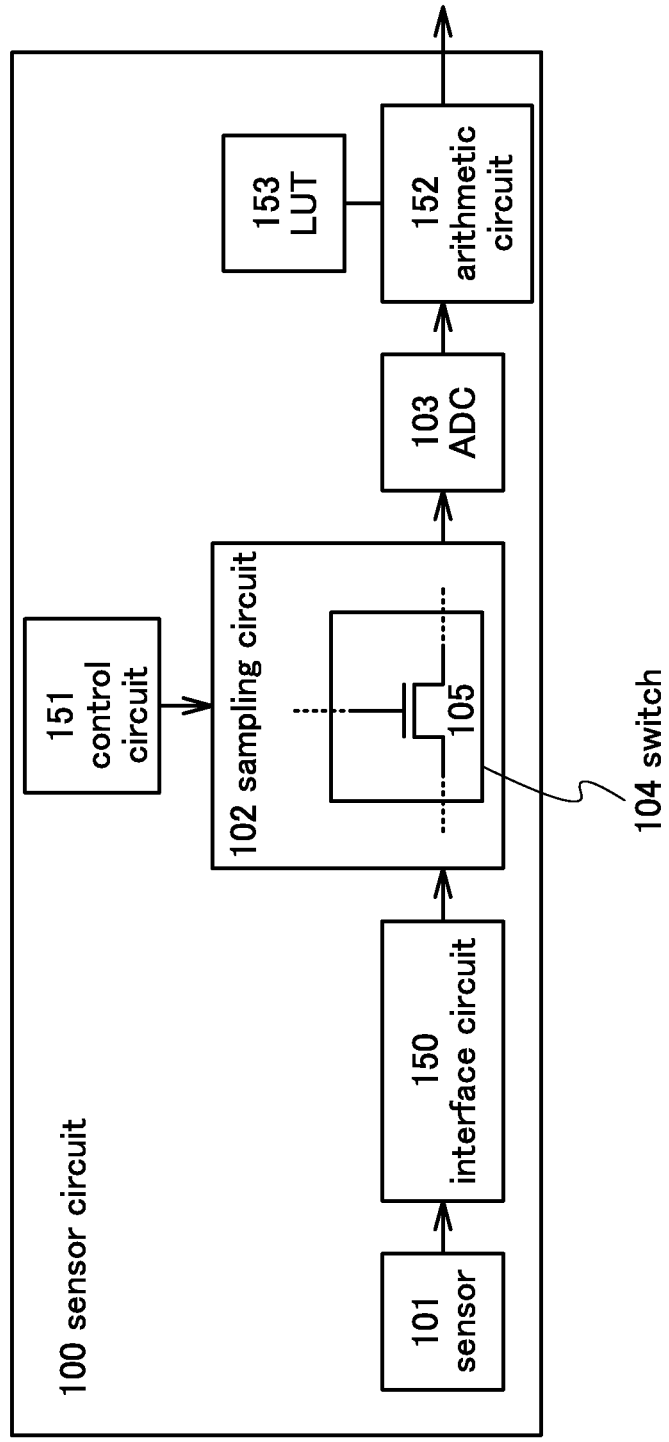
FIG. 7 illustrates a structure of a sensor circuit.

FIG. 7 is a block diagram illustrating an example of the structure of the sensor circuit 100 of one embodiment of the present invention. The sensor circuit 100 illustrated in FIG. 7 includes, in addition to the sensor 101, the sampling circuit 102, and the ADC 103, an interface circuit 150, a control circuit 151, an arithmetic circuit 152, and a look up table (LUT) 153.

The interface circuit 150 has a function of processing a sensor signal output from the sensor 101 in accordance with the format of the ADC 103. For example, the interface circuit 150 may include an amplification circuit, a filter circuit, a linearized circuit, a compensation circuit, and the like.

The amplification circuit has a function of amplifying the sensor signal so that the voltage thereof is within the range (input range) of an analog voltage that can be converted into a digital signal in the ADC 103. The filter circuit has a function of removing noise from the sensor signal. The linearized circuit has a function of correcting the analog value so that the analog value of the sensor signal and the physical quantities of an object to be detected have a linear relationship. The compensation circuit has a function of arithmetically processing the sensor signal so that in the case where the physical quantities other than those of the object to be detected reflect on the analog value of the sensor signal, they are removed from the analog value.

The control circuit 151 controls the timing of sampling of a sensor signal in the sampling circuit 102. Specifically, the control circuit 151 has a function of generating a signal which controls switching of the switch 104. In the case of the sensor circuit 100 illustrated in FIG. 7, the signal generated in the control circuit 151 is applied to the gate electrode of the transistor 105.

The LUT 153 stores a collection of data in which a digital value of the sensor signal is related to the physical quantities of an object to be detected. The arithmetic circuit 152 has a function of, with reference to the data stored in the LUT 153, performing arithmetic processing with the use of a digital value of the sensor signal output from the ADC 103 so as to generate a sensor signal including as information the physical quantities of an object to be detected, the sensor signal meeting the standard of the circuit or device in the subsequent step.

Note that the sensor circuit 100 of one embodiment of the present invention may further include a memory device for storing other data used for arithmetic processing in the arithmetic circuit 152, a buffer memory device for temporarily storing data in the arithmetic processing, or the like.

Next, an example of an IC temperature sensor is described, the IC temperature sensor utilizing the phenomenon that a forward voltage of a diode varies linearly with the temperature.

Figure 8:
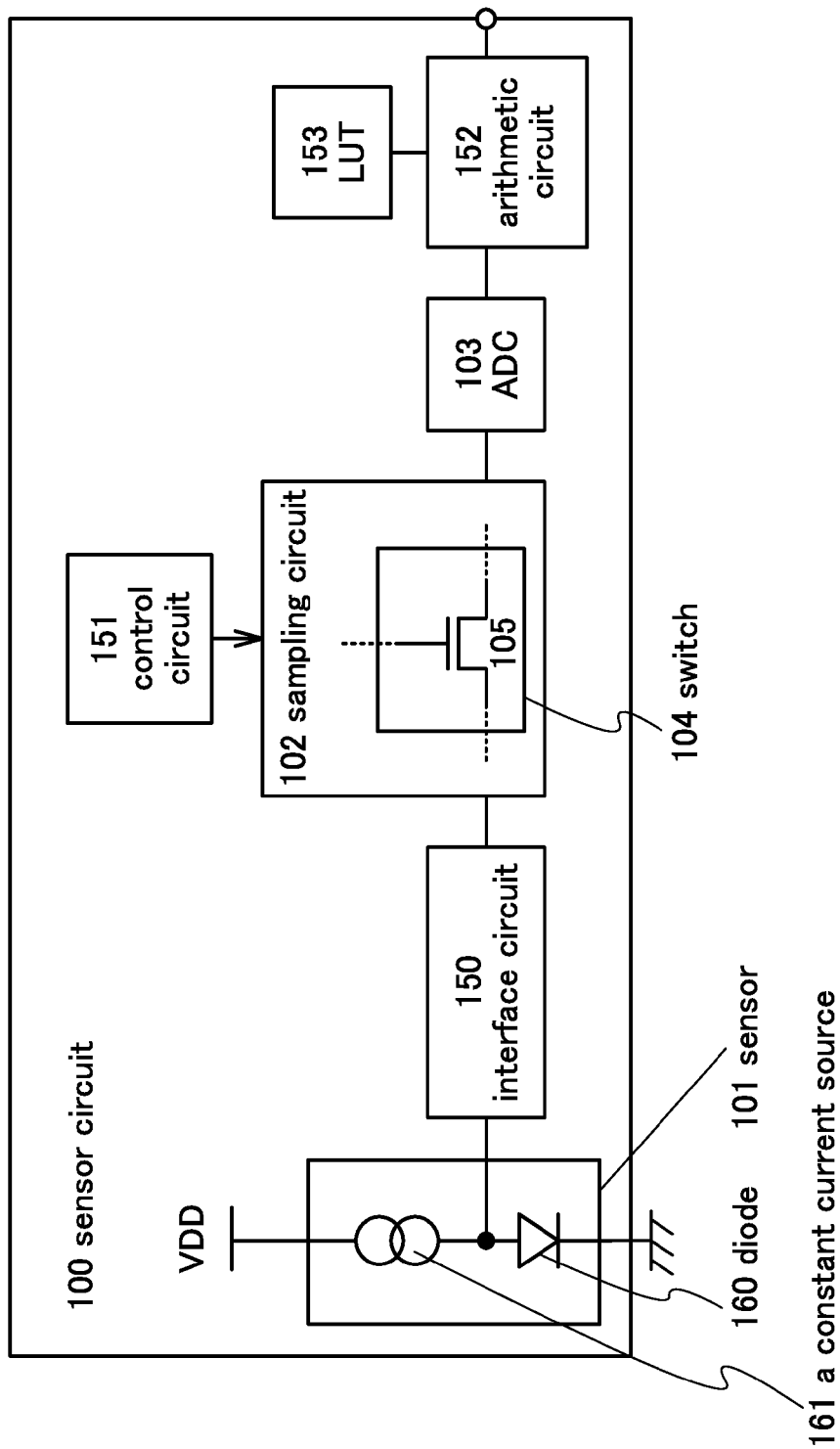
FIG. 8 illustrates a structure of a sensor circuit.

The sensor circuit 100 illustrated in FIG. 8 corresponds to an example of the IC temperature sensor and includes, like the sensor circuit 100 illustrated in FIG. 7, the sensor 101, the sampling circuit 102, the ADC 103, the interface circuit 150, the control circuit 151, the arithmetic circuit 152, and the LUT 153. The sensor 101 includes a diode 160 and a constant current source 161.

In the sensor 101, the diode 160 and the constant current source 161 are connected in series with each other between a node to which a reference potential such as a ground potential is applied and a node to which a VDD higher than the reference potential is applied. Specifically, a cathode of the diode 160 is connected to the node to which the reference potential is applied, and the constant current source 161 is connected between an anode of the diode 160 and the node to which the VDD is applied.

In the sensor 101, a forward voltage $V_F$ is defined as a voltage between the cathode and the anode of the diode 160 when a predetermined forward current $I_F$ flows from the constant current source 161 to the diode 160. The forward voltage $V_F$ tends to decrease as the temperature of the diode 160 rises. Specifically, in the case of the diode 160 using silicon, the forward voltage $V_F$ varies at a rate of about −2 mV/° C. Thus, it can be said that the forward voltage $V_F$ reflects the physical quantities of an object to be detected, specifically, the temperature.

Then, the value of the forward voltage $V_F$ is applied as an analog sensor signal to the sampling circuit 102 through the interface circuit 150.

Note that in the sensor circuit of one embodiment of the present invention, a method in which the forward current $I_F$ of the diode is measured with the forward voltage $V_F$ kept constant may be used instead of the method shown in FIG. 8 in which the forward voltage $V_F$ of the diode is measured with the forward current $I_F$ kept constant. However, the latter method is preferably used because a weak sensor signal can be accurately measured without the influence of noise.

Next, an example of a temperature sensor using a thermocouple is described.

Figure 9:
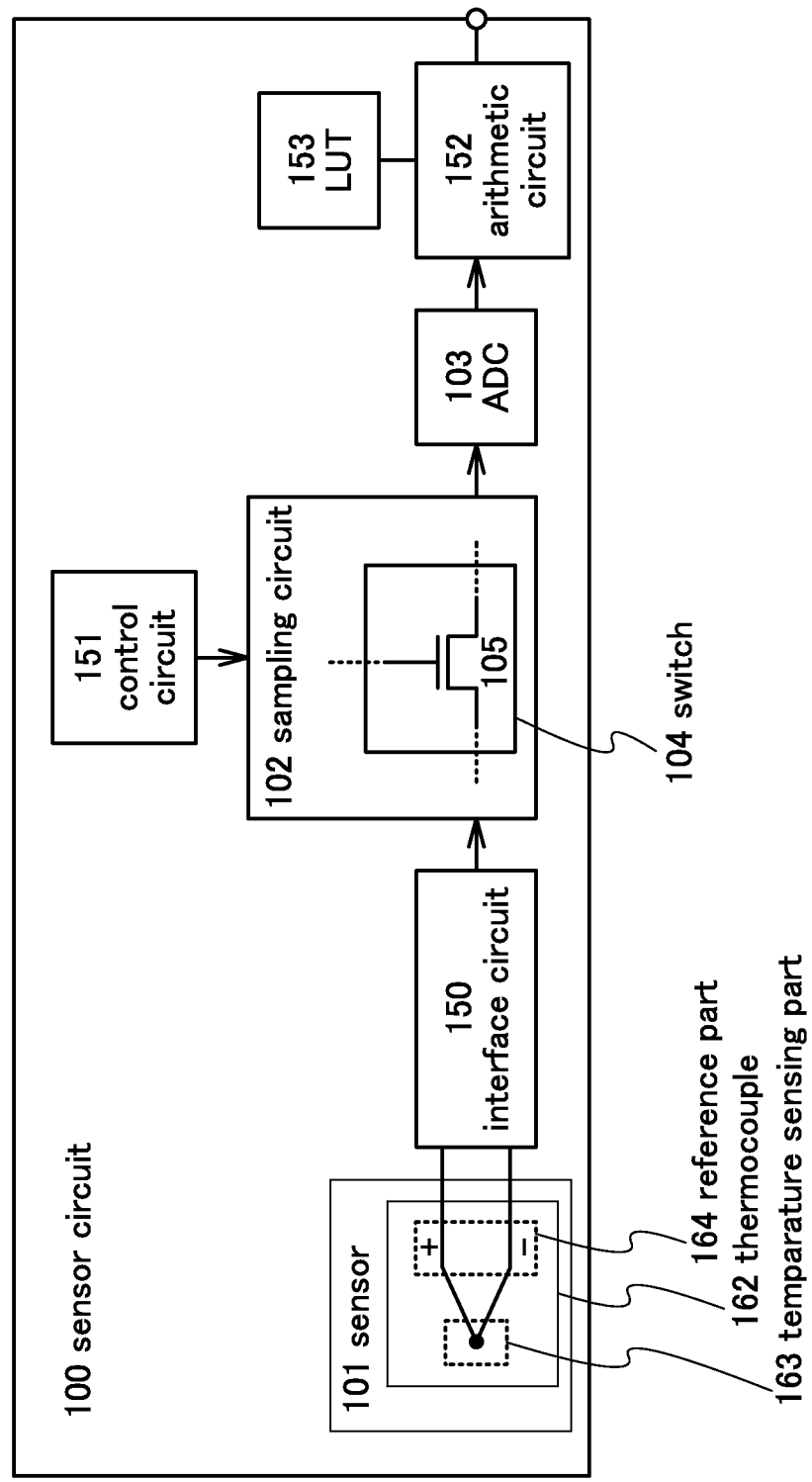
FIG. 9 illustrates a structure of a sensor circuit.

The sensor circuit 100 illustrated in FIG. 9 corresponds to an example of the temperature sensor using a thermocouple and includes, like the sensor circuit 100 illustrated in FIG. 7, the sensor 101, the sampling circuit 102, the ADC 103, the interface circuit 150, the control circuit 151, the arithmetic circuit 152, and the LUT 153. The sensor 101 includes a thermocouple 162.

The thermocouple 162 includes a temperature sensing part 163 including a junction of two dissimilar conductors and a reference part 164 in which the two conductors are separated from each other. When there is a difference in temperature between the temperature sensing part 163 and the reference part 164, thermoelectromotive force E is generated between the two conductors (plus and minus legs) in the reference part 164 of the thermocouple 162. The thermoelectromotive force E increases with an increase in the temperature difference between the temperature sensing part 163 and the reference part 164. Thus, it can be said that the thermoelectromotive force E reflects the physical quantities of an object to be detected, specifically, the temperature.

Then, the value of the thermoelectromotive force E is applied as an analog sensor signal to the sampling circuit 102 through the interface circuit 150.

Next, an example of a magnetic sensor using a magnetoresistance (MR) element is described.

Figure 10:
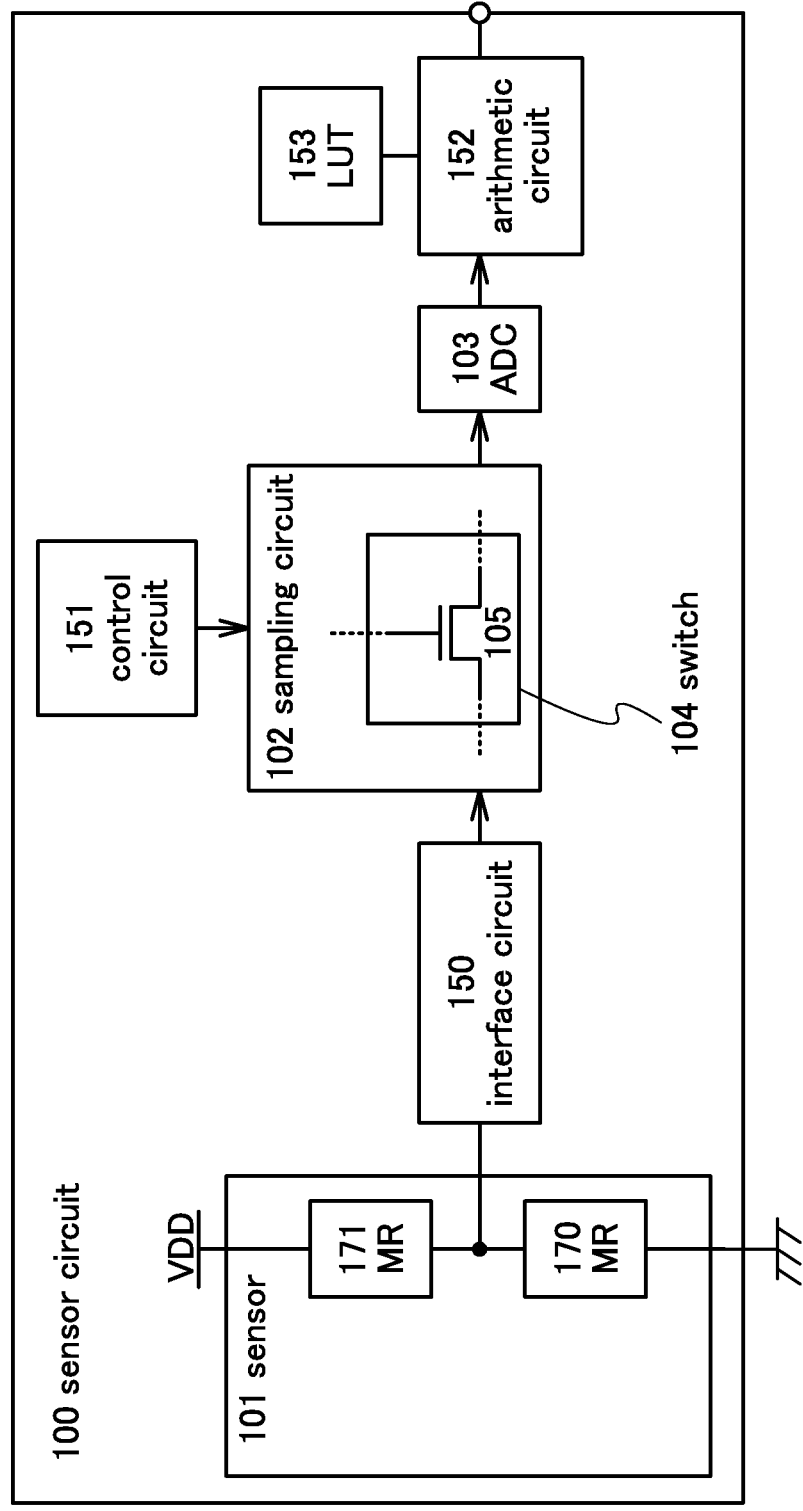
FIG. 10 illustrates a structure of a sensor circuit.

The sensor circuit 100 illustrated in FIG. 10 corresponds to an example of the magnetic sensor using an MR element and includes, like the sensor circuit 100 illustrated in FIG. 7, the sensor 101, the sampling circuit 102, the ADC 103, the interface circuit 150, the control circuit 151, the arithmetic circuit 152, and the LUT 153. The sensor 101 includes an MR element 170 and an MR element 171.

In the sensor 101, the MR element 170 and the MR element 171 are connected in series with each other between a node to which a reference potential such as a ground potential is applied and a node to which a VDD higher than the reference potential is applied. The internal resistance of each of the MR element 170 and the MR element 171 increases as the magnetic flux density thereof increases. For example, in an environment where a specific magnetic flux density is obtained, the internal resistances of the MR element 170 and the MR element 171 are assumed to be R1 and R2, respectively. Then, the following formula 1 is satisfied, where Vgnd is a reference potential and Vs is a potential of a node between the MR element 170 and the MR element 171.

$$(Vs-Vgnd)=(Vdd-Vgnd)\times R1/(R1+R2) \quad \text{(Formula 1)}$$

From the above, the value of the potential Vs is determined by the resistance R1 of the MR element 170 and the resistance R2 of the MR element 171; therefore, it can be said that the potential Vs reflects the physical quantities of an object to be detected, specifically, the magnetic flux density.

FIG. 10 shows an example where the two MR elements connected in series are used for forming the magnetic sensor, though the magnetic sensor may be formed using a single MR element or three or more MR elements. Note that in the case where a plurality of MR elements are used, as seen from Formula 1, the temperature coefficient included in the denominator (R1+R2) and that included in the numerator (R1) are cancelled. Consequently, the temperature does not influence the potential Vs even in the case where the MR element has a high temperature coefficient and the internal resistance of the MR element is significantly affected by the temperature.

<Example of Structure of Sampling Circuit>

Next, an example of the structure of the sampling circuit 102 is described.

Figure 6:
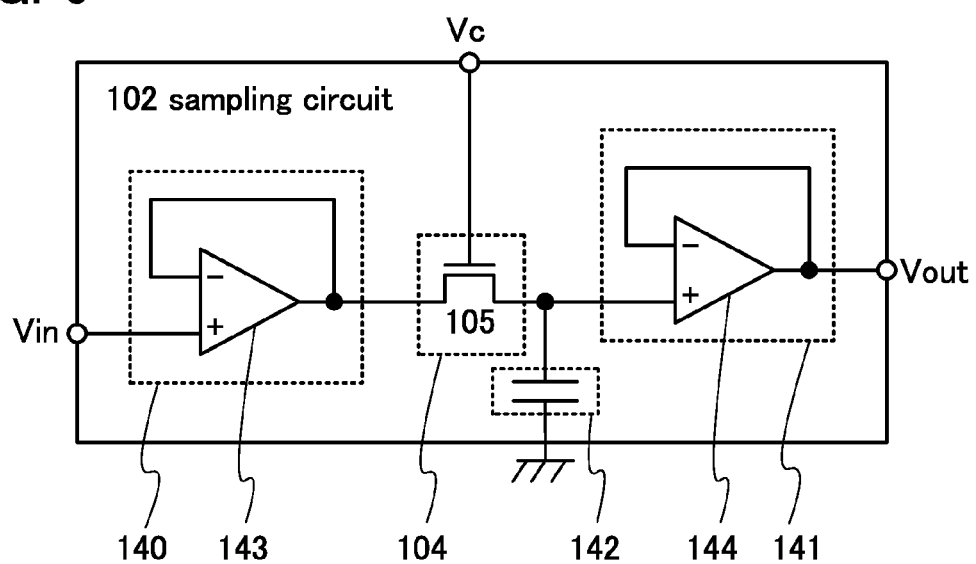
FIG. 6 illustrates a structure of a sampling circuit.

FIG. 6 shows an example of a circuit diagram of the sampling circuit 102. The sampling circuit 102 illustrated in FIG. 6 includes, in addition to the switch 104, an impedance converter 140, an impedance converter 141, and a capacitor 142.

Each of the impedance converter 140 and the impedance converter 141 has much higher input impedance than the output impedance. Accordingly, a voltage value of a sensor signal output from the sensor 101 can be transmitted to the ADC 103 without being varied in the sampling circuit 102. Thus, even when the sensor signal output from the sensor 101 has a small voltage value, the physical quantities of an object to be detected can be accurately obtained.

Specifically, the impedance converter 140 includes an amplifier 143 whose inverting input terminal (−) and output terminal are connected to each other. The impedance converter 141 includes an amplifier 144 whose inverting input terminal (−) and output terminal are connected to each other. A potential of a sensor signal output from the sensor 101 is applied as a potential Vin to a non-inverting input terminal (+) of the amplifier 143. The switch 104 controls connection between the output terminal of the amplifier 143 and a non-inverting input terminal (+) of the amplifier 144. A potential Vout of the output terminal of the amplifier 144 is applied to the ADC 103.

Note that the term "connection" in this specification refers to electrical connection and corresponds to the state in which current, voltage, or a potential can be supplied or transmitted. Consequently, a connection state means not only a state of direct connection but also a state of indirect connection through a circuit element such as a wiring, a resistor, a diode, or a transistor so that current, voltage, or a potential can be supplied or transmitted.

The capacitor 142 has a function of holding a voltage value of a sensor signal transmitted through the impedance converter 140 and the switch 104. Specifically, a potential difference between a reference potential such as a ground potential and the potential Vin of a sensor signal is held in the capacitor 142 as the voltage value of the sensor signal.

FIG. 6 shows an example where the switch 104 includes a single transistor 105. Specifically, in FIG. 6, a potential Vc is applied to the gate electrode of the transistor 105, and switching is performed by the transistor 105 in accordance with the potential Vc.

For example, when the transistor 105 is turned on in accordance with the potential Vc, the potential Vin input to the sampling circuit 102 through the impedance converter 140 is applied to one electrode of the capacitor 142 and the non-inverting input terminal (+) of the impedance converter 141. As a result, the potential Vout of the output terminal of the impedance converter 141 becomes almost equal to the potential Vin. Further, the capacitor 142 holds a potential difference between the reference potential such as a ground potential and the potential Vin of the sensor signal.

After that, the transistor 105 is turned off in accordance with the potential Vc. Then, the output terminal of the impedance converter 140 is electrically isolated from the non-inverting input terminal (+) of the impedance converter 141. However, the capacitor 142 holds the charge accumulated by the potential Vin immediately before the transistor 105 is turned off. In one embodiment of the present invention, the transistor 105 has an extremely low off-state current independently of the temperature of the sampling circuit 102; therefore, the charge held in the capacitor 142 is less likely to leak through the transistor 105. Further, since the impedance converter 141 has much higher input impedance than the output impedance, the charge held in the capacitor 142 is less likely to leak through the impedance converter 141.

Thus, even after the transistor 105 is turned off, the potential applied to the non-inverting input terminal (+) of the impedance converter 141 is held by the capacitor 142 to keep the potential Vin immediately before the transistor 105 is turned off. Hence, in one embodiment of the present invention, even when the temperature of the sampling circuit 102 varies, it is possible to prevent a variation in the analog value of a sampled sensor signal, specifically, the value of the potential Vout, and prevent occurrence of a great margin of error of the digital value of the sensor signal obtained by AD conversion.

<Structure of Semiconductor Device>

Figure 11:
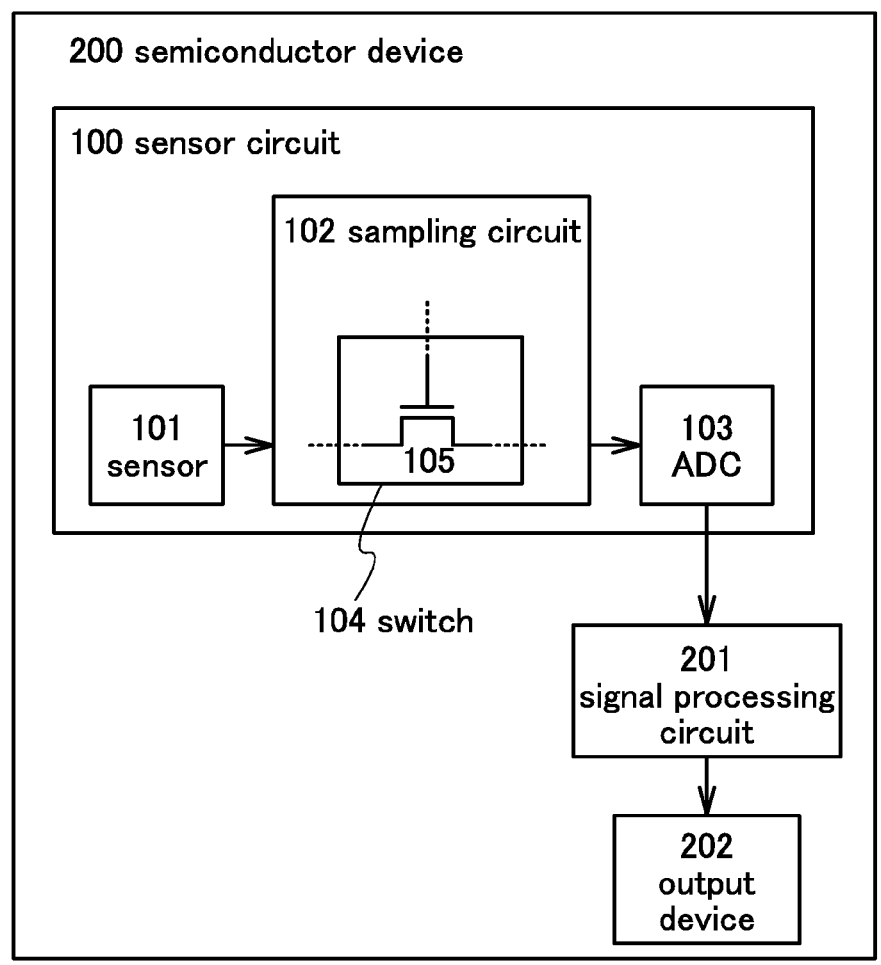
FIG. 11 illustrates a structure of a semiconductor device.

FIG. 11 is an example of a block diagram illustrating a structure of a semiconductor device 200 of one embodiment of the present invention. The semiconductor device 200 illustrated in FIG. 11 includes the sensor circuit 100, a signal processing circuit 201, and an output device 202. The sensor circuit 100 includes, as in FIG. 1A, the sensor 101, the sampling circuit 102, and the ADC 103.

A sensor signal output from the sensor circuit 100 is applied to the signal processing circuit 201. By using the sensor signal, the signal processing circuit 201 generates a signal for controlling the operation of the output device 202. Specifically, the signal includes the following: a signal for outputting information on the physical quantities which is included in the sensor signal to the output device 202, a signal for changing the operation of the output device 202 in accordance with the physical quantities included as information in the sensor signal, a signal for storing information on the physical quantities included in the sensor signal in the output device 202, or the like.

As specific examples of the output device 202, a display device, a printer, a plotter, an audio output device, an external memory device, and the like can be given. For example, in the case where the sensor signal includes temperature information, the temperature information can be displayed on a display device used as the output device 202. Also in the case where the sensor signal includes temperature information, the temperature information can be used to control the luminance or contrast of a display device used as the output device 202 so that the luminance or contrast of the display device is not changed with the temperature. Alternatively, an external memory device can be used as the output device 202 so that information on the physical quantities included in the sensor signal is stored in the external memory device.

An example of the semiconductor device 200 of one embodiment of the present invention is described with reference to FIG. 12.

In a liquid crystal display device, optical properties of a liquid crystal material used for a liquid crystal layer, specifically, transmittance thereof with respect to an applied voltage varies with temperature in some cases. In the semiconductor device 200 illustrated in FIG. 12, the sensor 101 measures the temperature of a liquid crystal layer which is an object to be detected, and a voltage applied to a liquid crystal element is controlled with the temperature in a liquid crystal display device which is the output device 202, whereby a change in contrast due to a temperature change can be prevented.

Figure 12:
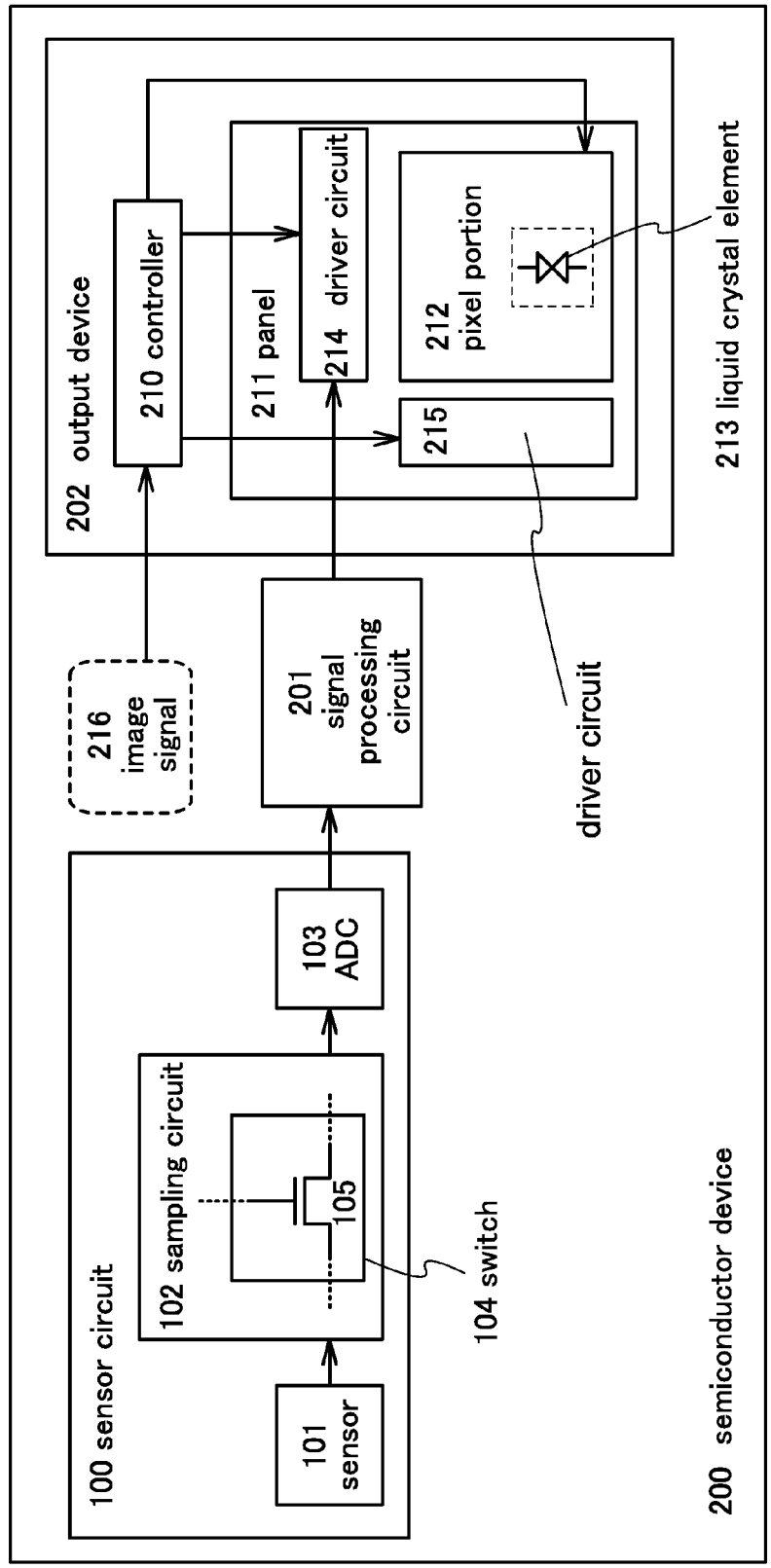
FIG. 12 illustrates a structure of a semiconductor device.

Specifically, the semiconductor device 200 illustrated in FIG. 12 includes, like the semiconductor device 200 illustrated in FIG. 11, the sensor circuit 100, the signal processing circuit 201, and the output device 202. Further, in FIG. 12, the output device 202 includes a controller 210 and a panel 211. Moreover, the panel 211 includes a pixel portion 212 provided with a liquid crystal element 213 in each pixel, and a driver circuit 214 and a driver circuit 215 which control the operation of the pixel portion 212. The liquid crystal element 213 includes a pixel electrode whose potential is controlled by an image signal, a common electrode to which a predetermined reference potential is applied, and a liquid crystal layer to which a voltage is applied from the pixel electrode and the common electrode.

A sensor signal including information on the temperature of the liquid crystal element 213 is input from the sensor circuit 100 to the signal processing circuit 201. In accordance with the sensor signal including the temperature information, the signal processing circuit 201 generates a signal for controlling the transmittance of the liquid crystal element 213. In the output device 202, the controller 210 adjusts, for example, a reference potential applied to the common electrode in accordance with the signal for controlling the transmittance of the liquid crystal element 213, so as to control a voltage applied to the liquid crystal element 213.

The controller 210 has a function of processing an image signal 216 and supplying the image signal 216 to the driver circuit 214 or the driver circuit 215, or a function of generating a driving signal for controlling the operation of the driver circuit 214 and the driver circuit 215 and supplying the driving signal to the driver circuit 214 and the driver circuit 215.

<Comparative Example of Transistor>

Figure 3A:
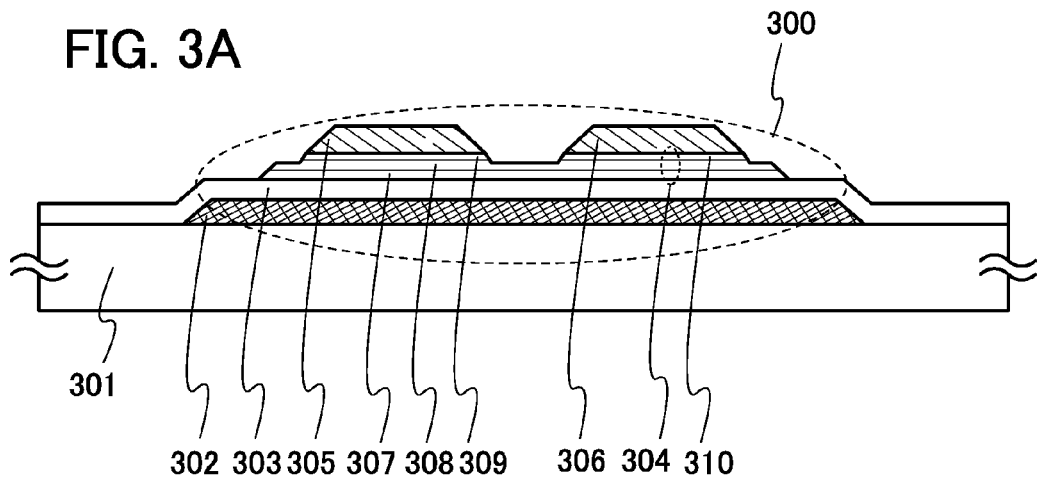
FIGS. 3A and 3B each illustrate a structure of a transistor.
Figure 3B:
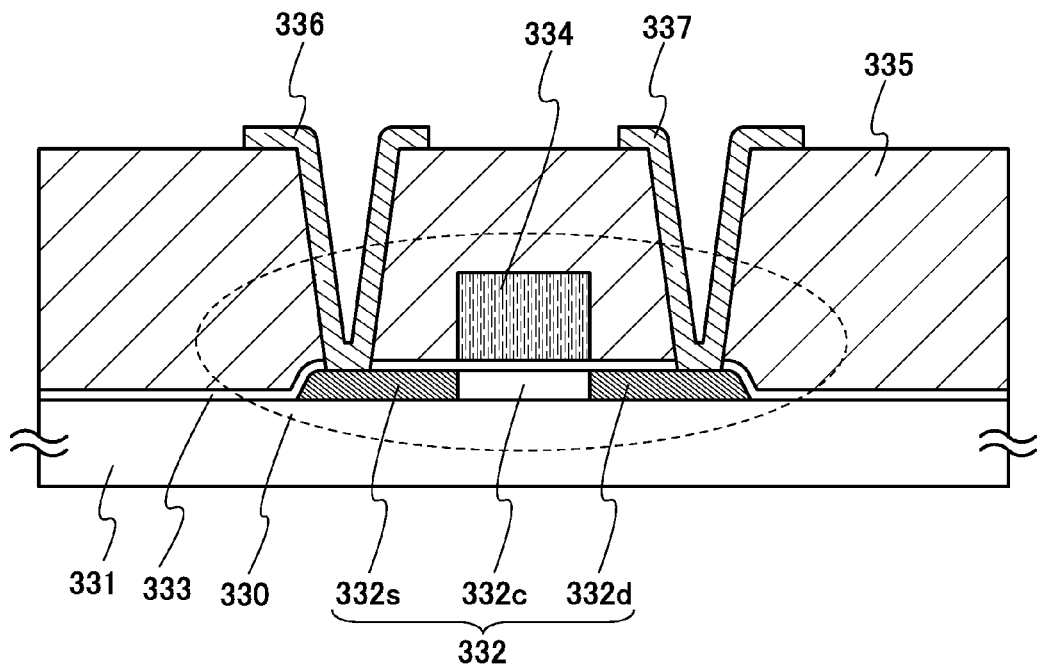

Next, a transistor including silicon in an active layer is formed as a comparative example, and actual measured values of a drain current Id of the transistor against a gate voltage Vg thereof are described, the values being measured while the temperature of a substrate is changed. FIGS. 3A and 3B each illustrate a specific structure of the transistor used for measurement.

A transistor 300 illustrated in FIG. 3A includes, over a substrate 301 having an insulating surface, a gate electrode 302, a gate insulating film 303 over the gate electrode 302, a semiconductor film 304 serving as an active layer which overlaps with the gate electrode 302 with the gate insulating film 303 interposed therebetween, and a source electrode 305 and a drain electrode 306 over the semiconductor film 304. The semiconductor film 304 includes a microcrystalline semiconductor layer 307, an amorphous semiconductor layer 308 over the microcrystalline semiconductor layer 307, and an impurity semiconductor layer 309 serving as a source region and an impurity semiconductor layer 310 serving as a drain region which are provided over the amorphous semiconductor layer 308. The impurity semiconductor layer 309 is provided between the amorphous semiconductor layer 308 and the source electrode 305, and the impurity semiconductor layer 310 is provided between the amorphous semiconductor layer 308 and the drain electrode 306.

Note that the microcrystalline semiconductor layer 307 includes microcrystalline silicon. Microcrystalline silicon is silicon having an intermediate structure between an amorphous structure and a crystalline structure (including a single crystal structure and a polycrystalline structure). The amorphous semiconductor layer 308 includes amorphous silicon containing nitrogen. The impurity semiconductor layer 309 and the impurity semiconductor layer 310 include amorphous silicon to which phosphorus is added.

In the transistor 300 illustrated in FIG. 3A, the channel length L (the length of a channel formation region in the direction in which carriers move) is 3.7 μm, and the channel width W (the length of the channel formation region in the direction perpendicular to the direction in which carriers move) is 22 μm. The microcrystalline semiconductor layer 307 has a thickness of 30 nm, the amorphous semiconductor layer 308 has a thickness of 175 nm, and each of the impurity semiconductor layer 309 and the impurity semiconductor layer 310 has a thickness of 50 nm. An insulating film used as the gate insulating film 303 has a structure in which a silicon oxynitride film with a thickness of 110 nm is stacked over a silicon nitride film with a thickness of 110 nm. The gate electrode 302 is formed using a conductive film in which a titanium film with a thickness of 50 nm, an aluminum film with a thickness of 380 nm, and a titanium film with a thickness of 120 nm are stacked in this order. Each of the source electrode 305 and the drain electrode 306 is formed using a conductive film in which a titanium film with a thickness of 50 nm, an aluminum film with a thickness of 200 nm, and a titanium film with a thickness of 50 nm are stacked in this order.

A transistor 330 illustrated in FIG. 3B includes, over a substrate 331 having an insulating surface, a semiconductor film 332 containing single crystal silicon which serves as an active layer, a gate insulating film 333 over the semiconductor film 332, a gate electrode 334 which overlaps with the semiconductor film 332 with the gate insulating film 333 interposed therebetween, and a source electrode 336 and a drain electrode 337. The semiconductor film 332 includes a channel formation region 332c overlapping with the gate electrode 334, and a source region 332s and a drain region 332d between which the channel formation region 332c is interposed. The transistor 330 is covered with an insulating film 335, and the source electrode 336 and the drain electrode 337 are connected to the source region 332s and the drain region 332d, respectively, through openings formed in the gate insulating film 333 and the insulating film 335.

In the transistor 330 illustrated in FIG. 3B, the channel length L (the length of the channel formation region in the direction in which carriers move) is 3 μm, and the channel width W (the length of the channel formation region in the direction perpendicular to the direction in which carriers move) is 8 μm. The semiconductor film 332 has a thickness of 60 nm. An insulating film used as the gate insulating film 333 has a structure in which a silicon oxynitride film with a thickness of 10 nm is stacked over a silicon oxide film with a thickness of 10 nm. The gate electrode 334 is formed using a conductive film in which a tungsten film with a thickness of 370 nm is stacked over a tungsten nitride film with a thickness of 30 nm. Each of the source electrode 336 and the drain electrode 337 is formed using a conductive film in which a titanium film with a thickness of 60 nm, a titanium nitride film with a thickness of 40 nm, an aluminum film with a thickness of 300 nm, and a titanium film with a thickness of 100 nm are stacked in this order.

The measurement of the transistor 300 illustrated in FIG. 3A is performed with drain voltages Vd of 1 V and 10 V. The measurement of the transistor 330 illustrated in FIG. 3B is performed with drain voltages of 0.1 V and 3 V. The substrate temperature used for the measurement is −25° C., 25° C., 100° C., and 150° C. for both the transistor 300 in FIG. 3A and the transistor 330 in FIG. 3B.

Figure 4:
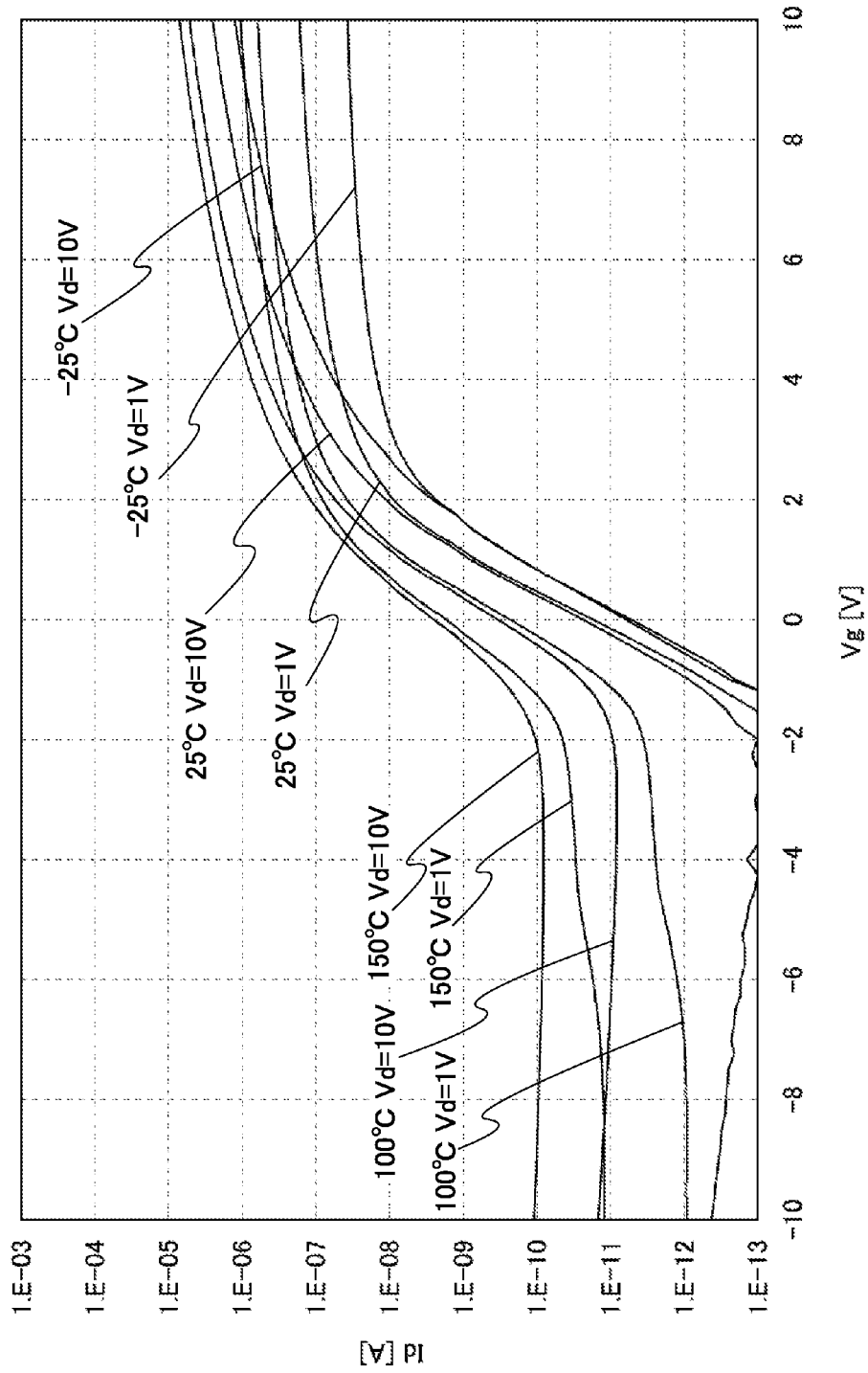
FIG. 4 illustrates a drain current value against a gate voltage.
Figure 5:
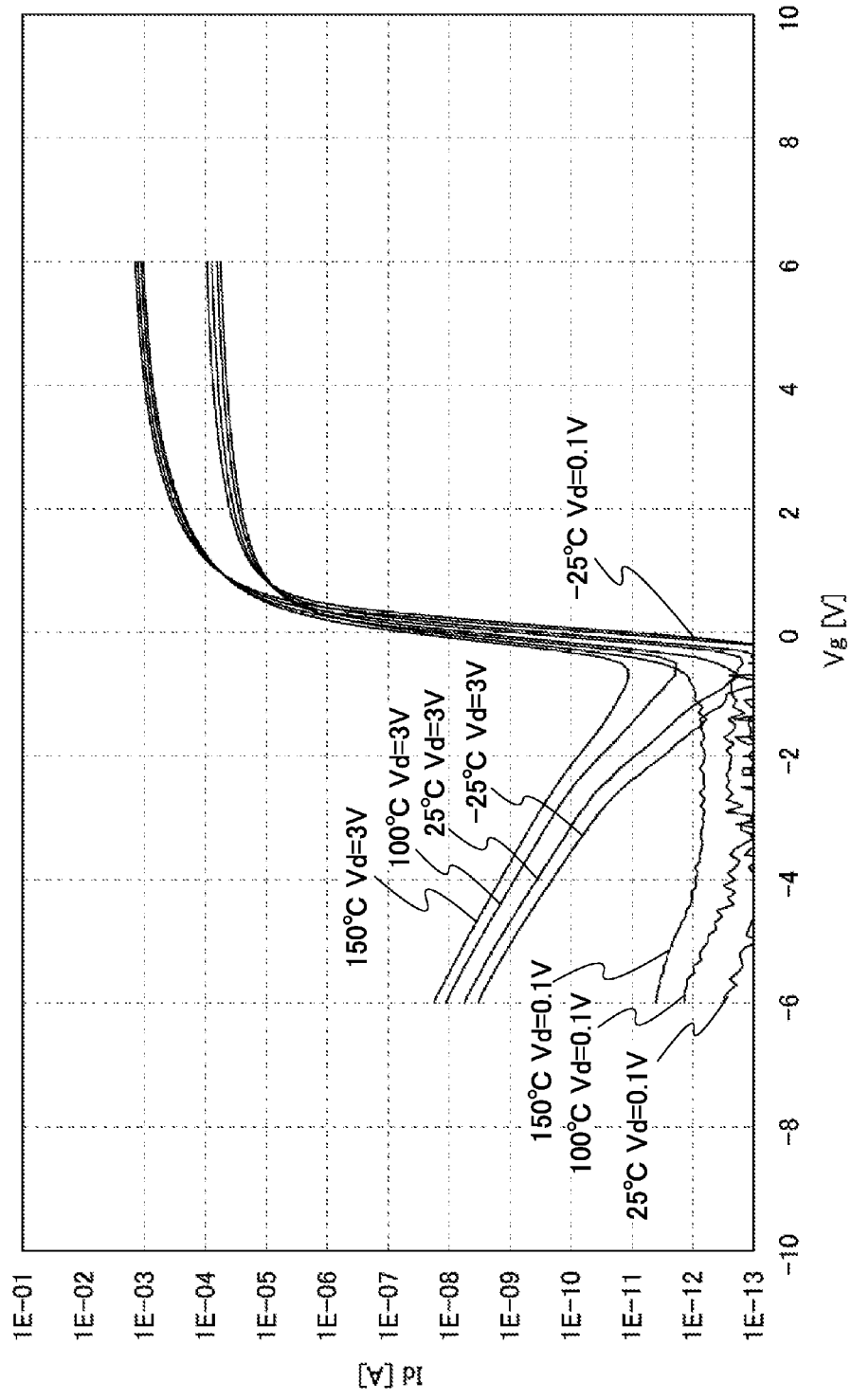
FIG. 5 illustrates a drain current value against a gate voltage.

FIG. 4 shows values of the drain current Id (A) of the transistor 300 in FIG. 3A against the gate voltage Vg (V) thereof, which are obtained by the measurement. FIG. 5 shows values of the drain current Id (A) of the transistor 330 in FIG. 3B against the gate voltage Vg (V) thereof, which are obtained by the measurement.

FIG. 4 shows that in both cases of the drain voltages Vd of 1 V and 10 V, the off-state current of the transistor 300 increases with an increase in substrate temperature. FIG. 5 shows that in both cases of the drain voltages Vd of 0.1 V and 3 V, the off-state current of the transistor 330 also increases with an increase in substrate temperature. When the off-state current at the highest temperature of 150° C. is compared, the drain current Id of the transistor 105 is lower than $1 \times 10^{-13}$ A, which is the lowest measurement limit, as shown in FIG. 2, whereas the drain currents Id of the transistor 300 and the transistor 330 are higher than $1 \times 10^{-13}$ A, which is the lowest measurement limit, as shown in FIG. 4 and FIG. 5, respectively.

The comparison results of the drain current Id show that the off-state current of the transistor including an oxide semiconductor in a channel formation region has an extremely low temperature dependence as compared to that of the transistor including silicon in a channel formation region. Accordingly, in the sensor circuit of one embodiment of the present invention, the amount of charge leaking through the switch 104 can be significantly reduced even when the temperature of the sampling circuit 102 varies, as compared to the case where the transistor including silicon in a channel formation region is used as the switch 104. Thus, the analog value of a sampled sensor signal can be prevented from varying, which prevents occurrence of a great margin of error of the digital value of the sensor signal obtained by AD conversion.

<Example of Structure of Transistor>

Next, a transistor using an oxide semiconductor film, which has a structure different from that of the transistor 105 illustrated in FIG. 1B, is described.

Figure 13A:
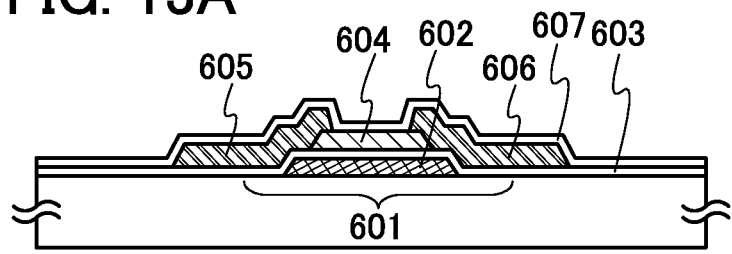
FIGS. 13A to 13D each illustrate a structure of a transistor.

A transistor 601 illustrated in FIG. 13A is a channel-etched bottom-gate transistor.

The transistor 601 includes a gate electrode 602 formed over an insulating surface, a gate insulating film 603 over the gate electrode 602, an oxide semiconductor film 604 serving as an active layer which overlaps with the gate electrode 602 with the gate insulating film 603 interposed therebetween, and a conductive film 605 and a conductive film 606 formed over the oxide semiconductor film 604. The transistor 601 may further include an insulating film 607 formed over the oxide semiconductor film 604 and the conductive films 605 and 606.

Note that the transistor 601 illustrated in FIG. 13A may further include a gate electrode which overlaps with the oxide semiconductor film 604 with the insulating film 607 interposed therebetween.

Figure 13B:
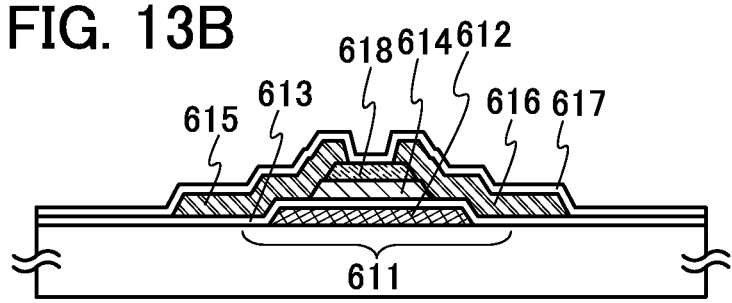

A transistor 611 illustrated in FIG. 13B is a channel-protective bottom-gate transistor.

The transistor 611 includes a gate electrode 612 formed over an insulating surface, a gate insulating film 613 over the gate electrode 612, an oxide semiconductor film 614 serving as an active layer which overlaps with the gate electrode 612 with the gate insulating film 613 interposed therebetween, a channel protective film 618 formed over the oxide semiconductor film 614, and a conductive film 615 and a conductive film 616 formed over the oxide semiconductor film 614. The transistor 611 may further include an insulating film 617 formed over the channel protective film 618 and the conductive films 615 and 616.

Note that the transistor 611 illustrated in FIG. 13B may further include a gate electrode which overlaps with the oxide semiconductor film 614 with the insulating film 617 interposed therebetween.

With the channel protective film 618, a portion of the oxide semiconductor film 614 which becomes a channel formation region can be prevented from being damaged in a later step (e.g., from being reduced in thickness due to plasma or an etchant in etching), whereby the reliability of the transistor 611 can be increased.

Figure 13C:
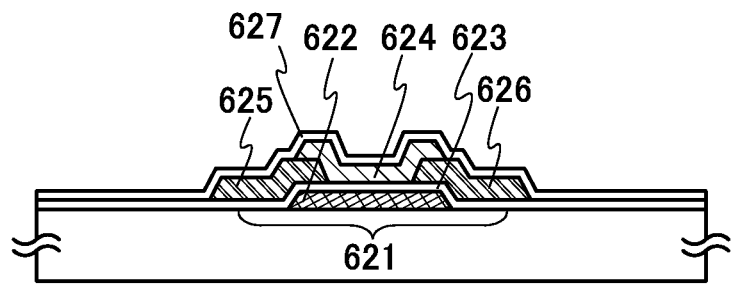

A transistor 621 illustrated in FIG. 13C is a bottom-contact bottom-gate transistor.

The transistor 621 includes a gate electrode 622 formed over an insulating surface, a gate insulating film 623 over the gate electrode 622, a conductive film 625 and a conductive film 626 formed over the gate insulating film 623, and an oxide semiconductor film 624 serving as an active layer which overlaps with the gate electrode 622 with the gate insulating film 623 interposed therebetween and which is formed over the conductive films 625 and 626. The transistor 621 may further include an insulating film 627 formed over the conductive films 625 and 626 and the oxide semiconductor film 624.

Note that the transistor 621 illustrated in FIG. 13C may further include a gate electrode which overlaps with the oxide semiconductor film 624 with the insulating film 627 interposed therebetween.

Figure 13D:
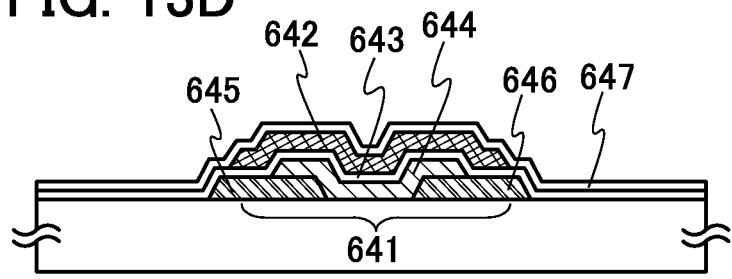

A transistor 641 illustrated in FIG. 13D is a bottom-contact top-gate transistor.

The transistor 641 includes a conductive film 645 and a conductive film 646 formed over an insulating surface, an oxide semiconductor film 644 serving as an active layer which is formed over the conductive films 645 and 646, a gate insulating film 643 formed over the oxide semiconductor film 644 and the conductive films 645 and 646, and a gate electrode 642 which overlaps with the oxide semiconductor film 644 with the gate insulating film 643 interposed therebetween. The transistor 641 may further include an insulating film 647 formed over the gate electrode 642.

<Example of Structure of Transistor>

Next, a transistor using an oxide semiconductor film, which has a structure different from that of the transistor 105 illustrated in FIG. 1B, is described.

Figure 15:
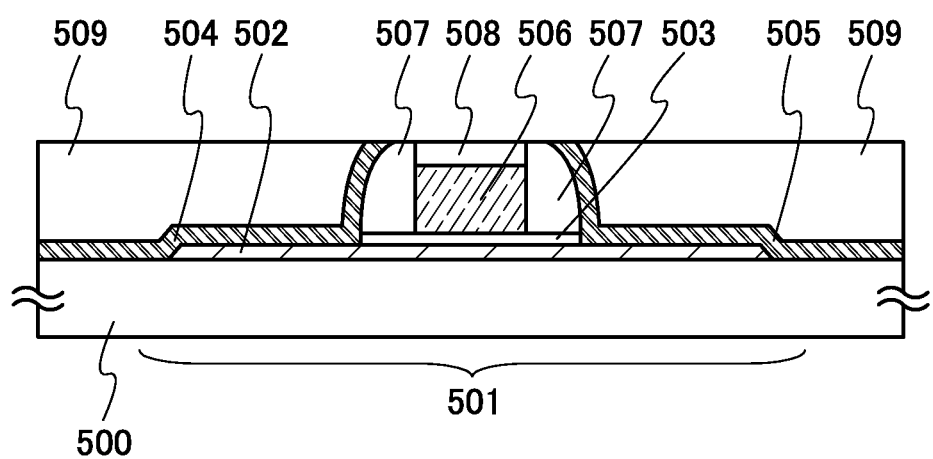
FIG. 15 illustrates a structure of a transistor.

A transistor 501 illustrated in FIG. 15 includes, over a substrate 500 having an insulating surface, a semiconductor film 502 including an oxide semiconductor, and a gate insulating film 503 over the semiconductor film 502. Note that the semiconductor film 502 is not completely covered with the gate insulating film 503. In the transistor 501, a conductive film 504 and a conductive film 505 serving as a source electrode or a drain electrode are formed over the semiconductor film 502. The semiconductor film 502 is connected to each of the conductive film 504 and the conductive film 505 in a region of the semiconductor film 502 which is not covered with the gate insulating film 503.

The transistor 501 also includes a gate electrode 506 and a sidewall 507 which overlap with the semiconductor film 502 with the gate insulating film 503 interposed therebetween. The sidewall 507 is provided on the side of the gate electrode 506. A part of the conductive film 504 and a part of the conductive film 505 overlap with the sidewall 507. An insulating film 509 is formed over the conductive films 504 and 505.

The conductive films 504 and 505 are not necessarily in contact with the sidewall 507. However, when the conductive films 504 and 505 are in contact with the sidewall 507, the area where the semiconductor film 502 is in contact with the conductive films 504 and 505 does not vary even in the case where the position of the conductive films 504 and 505 is somewhat misaligned. As a result, it is possible to prevent a variation in the on-state current of the transistor 501 due to misalignment of the conductive films 504 and 505.

An insulating film 508 is provided over the gate electrode 506. The insulating film 508 is not necessarily provided; however, the insulating film 508 over the gate electrode 506 prevents contact between the gate electrode 506 and the conductive films 504 and 505 even when the position of the conductive films 504 and 505 is misaligned so as to be formed above the gate electrode 506.

<Example of Structure of Stacked Transistor>

In a circuit, a sensor circuit, or a semiconductor device of one embodiment of the present invention, a transistor including a general semiconductor such as silicon or germanium in a channel formation region can be used for an impedance converter included in a sampling circuit, an ADC, and the like. Hereinafter described is a mode of a sensor circuit or a semiconductor device in which a transistor including silicon in a channel formation region and a transistor including an oxide semiconductor in a channel formation region are stacked over a substrate.

Figure 14:
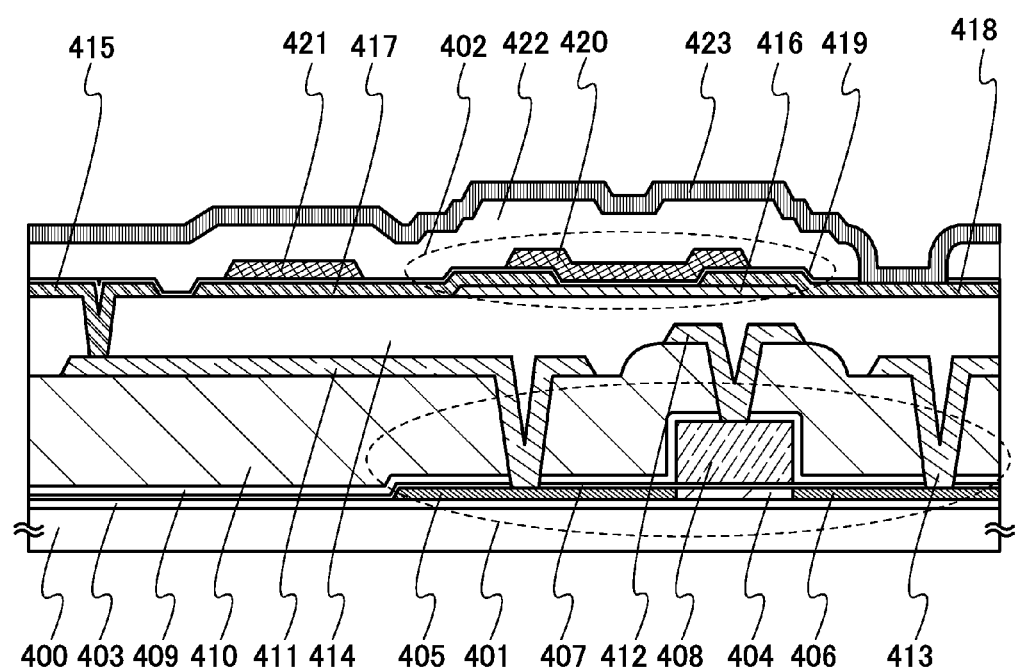
FIG. 14 illustrates a structure of a transistor.

FIG. 14 illustrates a cross-sectional structure of a transistor 401 and a transistor 402 which are stacked over a substrate 400.

Specifically, the transistor 401 includes, over an insulating film 403 provided over the substrate 400, a channel formation region 404, and an impurity region 405 and an impurity region 406 serving as a source region or a drain region, between which the channel formation region 404 is interposed. The channel formation region 404 and the impurity regions 405 and 406 correspond to a semiconductor film serving as an active layer and contain silicon. The transistor 401 also includes a gate insulating film 407 over the channel formation region 404 and the impurity regions 405 and 406, and a gate electrode 408 overlapping with the channel formation region 404 with the gate insulating film 407 interposed therebetween.

In FIG. 14, an insulating film 409 and an insulating film 410 are stacked over the transistor 401. Although the transistor 401 is covered with the insulating films 409 and 410 in FIG. 14, in one embodiment of the present invention, the transistor 401 may be covered with a single insulating film or three or more stacked insulating films instead of the insulating films 409 and 410.

Also in FIG. 14, openings are formed in the gate insulating film 407, the insulating film 409, and the insulating film 410. A conductive film 411, a conductive film 412, and a conductive film 413 which are provided over the insulating film 409 are connected to the impurity region 405, the gate electrode 408, and the impurity region 406, respectively, through the openings.

The transistor 401 may further include the conductive film 411 and the conductive film 413 serving as a source electrode or a drain electrode.

In FIG. 14, an insulating film 414 is provided over the insulating film 410 so as to cover the conductive film 411, the conductive film 412, and the conductive film 413. The insulating film 414 includes an opening, and a conductive film 415 provided over the insulating film 414 is connected to the conductive film 411 through the opening.

The transistor 402 includes, over the insulating film 414, a semiconductor film 416 including an oxide semiconductor which serves as an active layer, a conductive film 417 and a conductive film 418 over the semiconductor film 416 which serve as a source electrode or a drain electrode, a gate insulating film 419 over the semiconductor film 416, the conductive film 417, and the conductive film 418, and a gate electrode 420 over the gate insulating film 419 which overlaps with the semiconductor film 416 between the conductive film 417 and the conductive film 418.

In FIG. 14, a conductive film 421 is provided over the gate insulating film 419 so as to overlap with the conductive film 417. A region where the conductive film 417 overlaps with the conductive film 421 with the gate insulating film 419 interposed therebetween functions as a capacitor.

Also in FIG. 14, an insulating film 422 is provided to cover the transistor 402. The insulating film 422 includes an opening, and a conductive film 423 provided over the insulating film 422 is connected to the conductive film 418 through the opening.

Note that in the transistor 401, single crystal, polycrystalline, microcrystalline, or amorphous silicon can be used for the semiconductor film including the channel formation region 404 and the impurity regions 405 and 406. Although FIG. 14 illustrates the transistor 401 using a thin semiconductor film as an active layer, the transistor 401 may have a structure in which a channel formation region is formed in a single crystal semiconductor substrate.

In FIG. 14, the transistor 402 has the same structure as that of the transistor 105 illustrated in FIG. 1B; however, the transistor 402 may have the same structure as any of the transistors illustrated in FIGS. 13A to 13D and FIG. 15.

This application is based on Japanese Patent Application serial No. 2012-007688 filed with Japan Patent Office on Jan. 18, 2012, the entire contents of which are hereby incorporated by reference.

What is claimed is:

1. A circuit comprising:
a sampling circuit including a switch; and
an analog-to-digital converter circuit,
wherein the sampling circuit is configured to obtain an analog value of a signal during a predetermined period and hold the analog value,
wherein the switch comprises a transistor including an oxide semiconductor, and
wherein the analog-to-digital converter circuit is configured to convert the analog value which is held by the sampling circuit into a digital value.

2. The circuit according to claim 1,
wherein the analog value is one of an analog voltage value and an analog current value.

3. The circuit according to claim 1,
wherein the oxide semiconductor includes at least one of In, Ga, and Zn.

4. The circuit according to claim 1,
wherein the sampling circuit further includes a capacitor element.

5. The circuit according to claim 1,
wherein an off-state current density of the transistor is less than or equal to 100 zA/μm.

6. A sensor circuit comprising:
a sensor;
a sampling circuit including a switch; and
an analog-to-digital converter circuit,
wherein the sampling circuit is configured to obtain an analog value of a signal output from the sensor during a predetermined period and hold the analog value, wherein the switch comprises a transistor including an oxide semiconductor, and wherein the analog-to-digital converter circuit is configured to convert the analog value which is held by the sampling circuit into a digital value.

7. The sensor circuit according to claim 6, wherein the analog value is one of an analog voltage value and an analog current value.

8. The sensor circuit according to claim 6, wherein the oxide semiconductor includes at least one of In, Ga, and Zn.

9. The sensor circuit according to claim 6, wherein the sampling circuit further includes a capacitor element.

10. The sensor circuit according to claim 6, wherein an off-state current density of the transistor is less than or equal to 100 zA/μm.

11. The sensor circuit according to claim 6, wherein the sensor is one of a temperature sensor, a magnetic sensor, a light sensor, a microphone, a strain gauge, a pressure sensor, and a gas sensor.

12. A sensor circuit comprising:

a sensor;

a sampling circuit including a switch; and an analog-to-digital converter circuit, wherein the sampling circuit is configured to obtain an analog value of a signal output from the sensor when the switch is in a conduction state, wherein the sampling circuit is configured to hold the analog value when the switch is in a non-conduction state, wherein the switch comprises a transistor including an oxide semiconductor, and wherein the analog-to-digital converter circuit is configured to convert the analog value which is held by the sampling circuit into a digital value.

13. The sensor circuit according to claim 12, wherein the analog value is one of an analog voltage value and an analog current value.

14. The sensor circuit according to claim 12, wherein the oxide semiconductor includes at least one of In, Ga, and Zn.

15. The sensor circuit according to claim 12, wherein the sampling circuit further includes a capacitor element.

16. The sensor circuit according to claim 12, wherein an off-state current density of the transistor is less than or equal to 100 zA/μm.

17. The sensor circuit according to claim 12, wherein the sensor is one of a temperature sensor, a magnetic sensor, a light sensor, a microphone, a strain gauge, a pressure sensor, and a gas sensor.

18. The circuit according to claim 1, wherein an off-state current of the transistor is lower than $1\times10^{-13}$ A when the transistor is 150° C.

19. The sensor circuit according to claim 6, wherein an off-state current of the transistor is lower than $1\times10^{-13}$ A when the transistor is 150° C.

20. The sensor circuit according to claim 12, wherein an off-state current of the transistor is lower than $1\times10^{-13}$ A when the transistor is 150° C.

\* \* \* \* \*